United States Patent
Hoshino et al.

(10) Patent No.: US 7,662,700 B2
(45) Date of Patent: Feb. 16, 2010

(54) OPTICAL DEVICE WAFER DIVIDING METHOD

(75) Inventors: Hitoshi Hoshino, Ota-Ku (JP); Takashi Yamaguchi, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/468,411

(22) Filed: May 19, 2009

(65) Prior Publication Data

US 2009/0311848 A1 Dec. 17, 2009

(30) Foreign Application Priority Data

Jun. 13, 2008 (JP) .............................. 2008-154939

(51) Int. Cl.
*H01L 21/00* (2006.01)
(52) U.S. Cl. .................. 438/463; 438/113; 438/795
(58) Field of Classification Search ............... 438/33, 438/106–127, 455–465, 795–799; 257/E21.576; 219/121.72
See application file for complete search history.

(56) References Cited

U.S. PATENT DOCUMENTS

| | | | | |
|---|---|---|---|---|
| 6,830,946 B2 * | 12/2004 | Yanagisawa et al. | .......... | 438/26 |
| 6,943,047 B2 * | 9/2005 | Yanagisawa et al. | .......... | 438/22 |
| 6,972,204 B2 * | 12/2005 | Oohata et al. | .................. | 438/22 |
| 7,601,616 B2 * | 10/2009 | Morikazu et al. | ........... | 438/463 |
| 2008/0220591 A1 * | 9/2008 | Nakamura | ................... | 438/464 |
| 2008/0280421 A1 * | 11/2008 | Nakamura | ................... | 438/462 |
| 2008/0293218 A1 * | 11/2008 | Nakamura | ................... | 438/460 |
| 2008/0293220 A1 * | 11/2008 | Nakamura | ................... | 438/463 |
| 2009/0124063 A1 * | 5/2009 | Nakamura | ................... | 438/463 |
| 2009/0142906 A1 * | 6/2009 | Nakamura | ................... | 438/463 |
| 2009/0215245 A1 * | 8/2009 | Nakamura | ................... | 438/463 |

FOREIGN PATENT DOCUMENTS

JP A 10-305420 11/1998
JP A 2008-6492 1/2008

* cited by examiner

*Primary Examiner*—Savitri Mulpuri
(74) *Attorney, Agent, or Firm*—Greer, Burns & Crain, Ltd.

(57) ABSTRACT

An optical device wafer dividing method includes a rear surface grinding step for grinding a rear surface of the optical device wafer; a dicing tape sticking step for sticking the front surface of the optical device wafer bonded with the reinforcing substrate to the front surface of a dicing tape; a laser processing step for emitting a laser beam along the streets formed on the optical device wafer from the rear surface of the reinforcing substrate to perform laser processing on the reinforcing substrate along the streets to form fracture starting points; and a wafer dividing step for applying an external force along the fracture starting points of the reinforcing substrate to fracture the reinforcing substrate along the fracture starting points to fracture the optical device wafer along the streets.

4 Claims, 13 Drawing Sheets

OPTICAL DEVICE WAFER DIVIDING METHOD

BACKGROUND OF THE INVENTION

1. Field of the Invention

The present invention relates to an optical device wafer dividing method for dividing an optical device wafer into individual optical devices along streets formed in a latticelike pattern on the front surface of a substrate such as a sapphire substrate or the like, the optical device wafer being such that the optical devices such as gallium nitride-based compound semiconductors or the like are laminated on a plurality of areas meansed along the streets.

2. Description of the Related Art

An optical device wafer may be meansed into a plurality of areas along predetermined dividing lines called streets formed in a latticelike pattern on the front surface of a sapphire substrate, optical devices such as gallium nitride-based compound semiconductors or the like being laminated on the areas thus meansed. This optical device wafer is divided along the streets into individual optical devices such as light-emitting diodes, which are widely used in electric devices. Before divided along the streets, the optical device wafer mentioned above is ground from its rear face by a grinding device and machined into a given thickness. To achieve the weight reduction and downsizing of electric devices, optical devices have recently been required to have a thickness of 50 µm or less. However, if the optical device wafer is ground to have a thickness of as thin as 50 µm or less, there occurs a problem of cracking.

On the other hand, cutting the optical device wafer along the streets is usually carried out by a cutter rotating a cutting blade at high-speeds. However, since the sapphire substrate is a hard-ground material having high-Mohs hardness, it is necessary to slow down machining speed, which poses a problem of poor productivity. The following method has recently been proposed as a method of dividing a wafer such as an optical device wafer or the like. That is to say, a pulse laser beam having a wavelength capable of being absorbed by the wafer is directed along streets to form laser processing grooves. An external force is applied to the wafer along the laser processing grooves to fracture the wafer along the streets. (See e.g. Japanese Patent Laid-Open No. Hei 10-305420.)

Also the following method is proposed as the method of dividing a wafer such as an optical device wafer along streets. That is to say, a pulse laser beam having a wavelength capable of passing through the wafer is emitted along the street while being focused on the inside of the wafer. This continuously forms an altered layer inside the wafer along the street to lower the strength of the street. An external force is applied to the wafer along the street for fracture. (See e.g. Japanese Patent Laid-Open No. 2008-6492.)

In this way, the optical device wafer is irradiated with a laser beam along the streets of the optical device wafer to form the laser beam processing grooves or altered grooves, and is divided into individual optical devices along the streets formed with the laser processing grooves or altered grooves. In this case, altered materials produced by the laser processing are left on the lateral surfaces (the fracture surfaces) of the individually divided optical devices. This poses a problem of lowering the luminance of the optical device and of reducing die or bending strength.

SUMMARY OF THE INVENTION

Accordingly, it is an object of the present invention to provide an optical device wafer dividing method that can form an optical device wafer with reduced thickness, and that can prevent an optical device from being lowered in luminance and from being reduced in die strength.

In accordance with an aspect of the present invention, there is provided an optical device wafer dividing method for dividing an optical device wafer into individual optical devices along a plurality of streets, the optical device wafer being formed with the optical devices in a plurality of areas sectioned by the streets formed in a latticelike pattern on a front surface, the method including: a protection plate bonding step for bonding a front surface of the optical device wafer to a front surface of a high-rigid protection plate with a peelable adhesion bond; a rear surface grinding step for grinding a rear surface of the optical device wafer stuck to the protection plate to form the optical device wafer at a device finish thickness; a reinforcing substrate bonding step for bonding a front surface of a high-rigid reinforcing substrate to the rear surface of the optical device wafer subjected to the rear surface grinding step with a peelable adhesion bond; a wafer peeling-off step for peeling off the optical device wafer stuck with the reinforcing substrate from the protection plate; a dicing tape sticking step for sticking the front surface of the optical device wafer bonded with the reinforcing substrate to a front surface of a dicing tape; a laser processing step for emitting a laser beam along the streets formed on the optical device wafer from the rear surface of the reinforcing substrate bonded to the optical device wafer stuck to the dicing tape to perform laser processing on the reinforcing substrate along the streets to form fracture starting points; and a wafer dividing step for applying an external force along the fracture starting points of the reinforcing substrate subjected to the laser processing step to fracture the reinforcing substrate along the fracture starting points to fracture the optical device wafer along the streets into individual optical devices.

Preferably, the laser processing step is such that a laser beam having a wavelength capable of passing through the reinforcing substrate is directed to the reinforcing substrate while being focused on the inside of the reinforcing substrate, forming an altered layer serving as a fracture starting point along the street.

Alternately, the laser processing step described above is such that a laser beam having a wavelength capable of being absorbed by the reinforcing substrate is directed to the rear surface of the reinforcing substrate to form a laser processing groove serving as a fracture starting point along the street.

A picking-up step is performed which peels off and picks up, from the dicing tape, the optical devices divided by performing the wafer dividing step. A reinforcing substrate peeling-off step is performed which peels off the reinforcing substrate stuck to the optical devices divided before or after the picking-up step will be or has been performed.

According to the present invention, when the rear surface grinding step is performed in which the optical device wafer stuck to the protection plate is ground from its rear surface to have a device finish thickness, the high-rigid protection plate is bonded to the front surface of the optical device wafer. Therefore, even if being thinly formed, the optical device wafer will not be cracked. In addition, the optical device wafer divided along the streets in the wafer dividing step is fractured along the streets and divided into individual optical devices by the reinforcing substrate being fractured along the fracture starting points formed along the streets. Therefore, an altered portion produced by laser processing does not exist on the lateral surface (the fracture surface) of the divided optical device. Thus, the optical device will not be reduced in luminance and in die strength.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
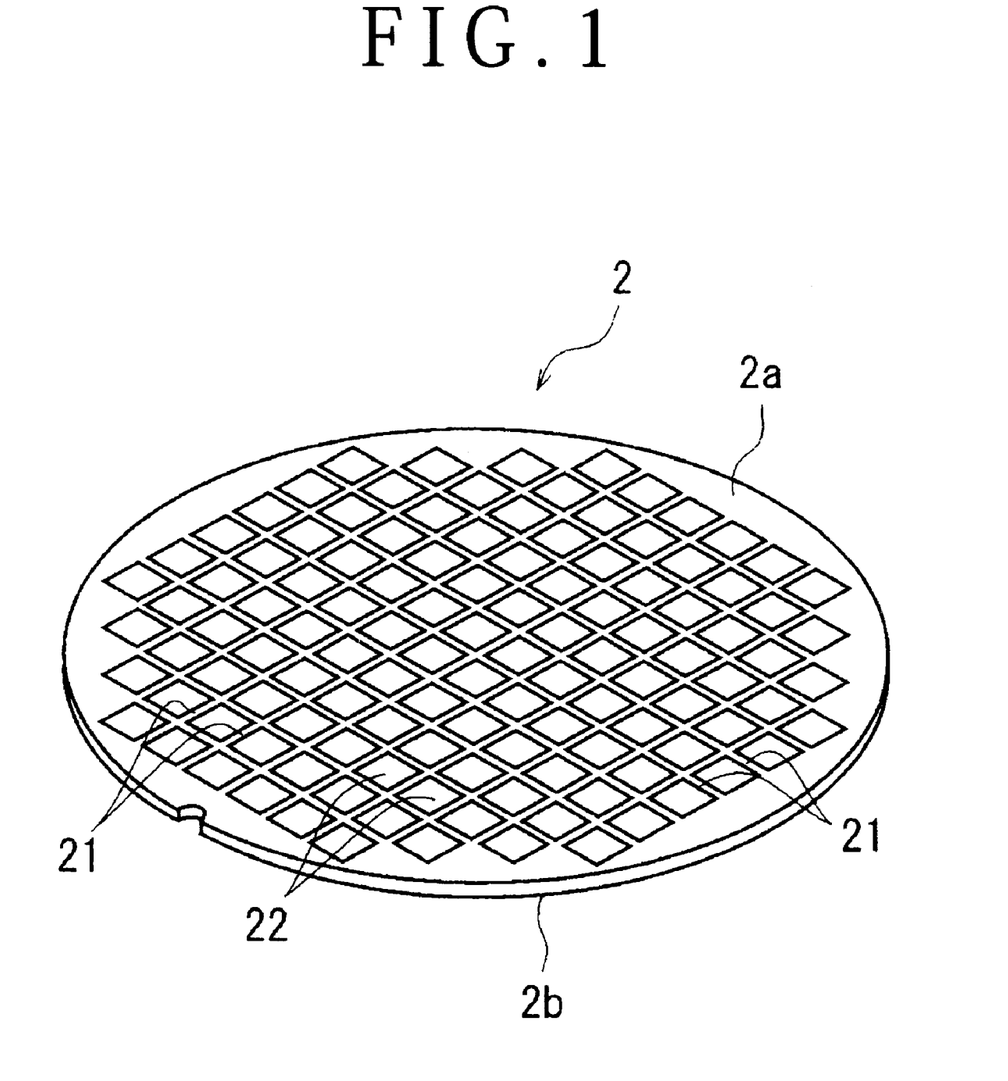
FIG. 1 is a perspective view of an optical device wafer divided by an optical device wafer dividing method according to the present invention.

Preferred embodiments of an optical device wafer dividing method according to the present invention will hereinafter be described in detail with reference to the accompanying drawings. FIG. 1 illustrates an optical device wafer 2 divided by the optical device wafer dividing method according to the present invention. The optical device wafer 2 illustrated in FIG. 1 is meansed into a plurality of areas along streets 21 formed in a latticelike pattern on a front surface 2a of a sapphire substrate which is, for example, a diameter of 50 mm and a thickness of 425 μm. A plurality of optical devices 22 such as light-emitting diodes are formed on the areas thus sectioned.

Figure 2A:
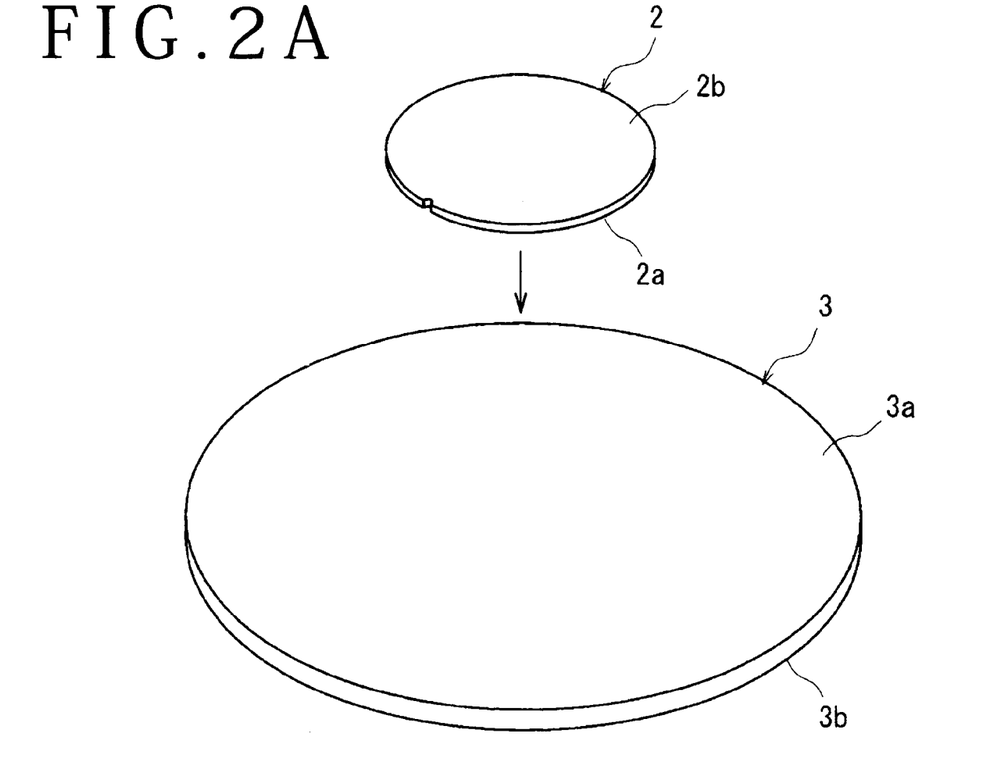
FIGS. 2A and 2B are explanatory views illustrating a protection plate sticking step in the optical device wafer dividing method according to the present invention.
Figure 2B:
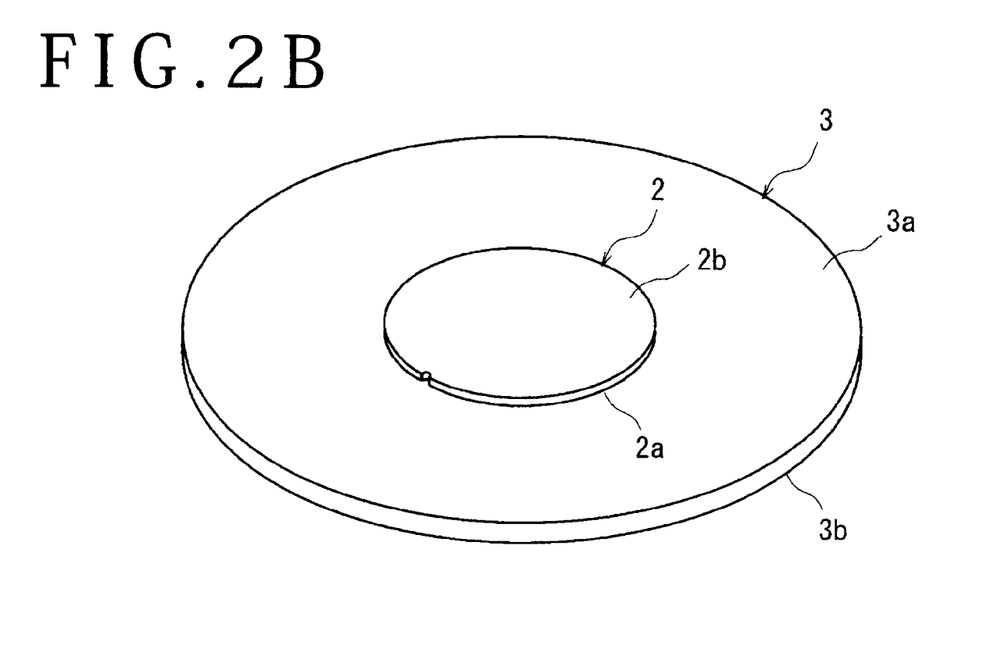

A protection plate bonding step is first performed to divide the optical device wafer 2 into the individual optical devices 22 along the streets 21 as described above. In this protection plate bonding step, the front surface 2a of the optical device wafer 22 is bonded on a front surface 3a of a high-rigid protection plate 3 with a peelable adhesion bond as illustrated in FIGS. 2A and 2B. The protection plate 3 is formed of a high-rigid material such as a glass substrate or the like in a disklike shape so as to have the flat front surface 3a and rear surface 3b. It is preferable that the protection plate 3 has a thickness of about 2 mm if it is formed of a glass substrate or the like. The material forming the protection plate 3 can use a ceramic, a metal material such as stainless steel, resin, etc., as well as the glass substrate. The peelable adhesion bond can use e.g. wax melting at a temperature of 70° C.

After the protection plate bonding step has been performed as described above, a rear surface grinding step is performed in which the rear surface 2b of the optical device wafer 2 stuck to the protection plate 3 is ground so that the optical device wafer 2 may be formed to have a device finish thickness. This rear surface grinding step is performed by a rough-grinding step and a finish-grinding step in the illustrated embodiment. The rough-grinding step is performed by a grinding device illustrated in FIG. 3. The grinding device 4 illustrated in FIG. 3 includes a chuck table 41 adapted to hold a workpiece and rough-grinding means 42a for rough-grinding a to-be-processed surface of the workpiece held on the chuck table 41.

Figure 3:
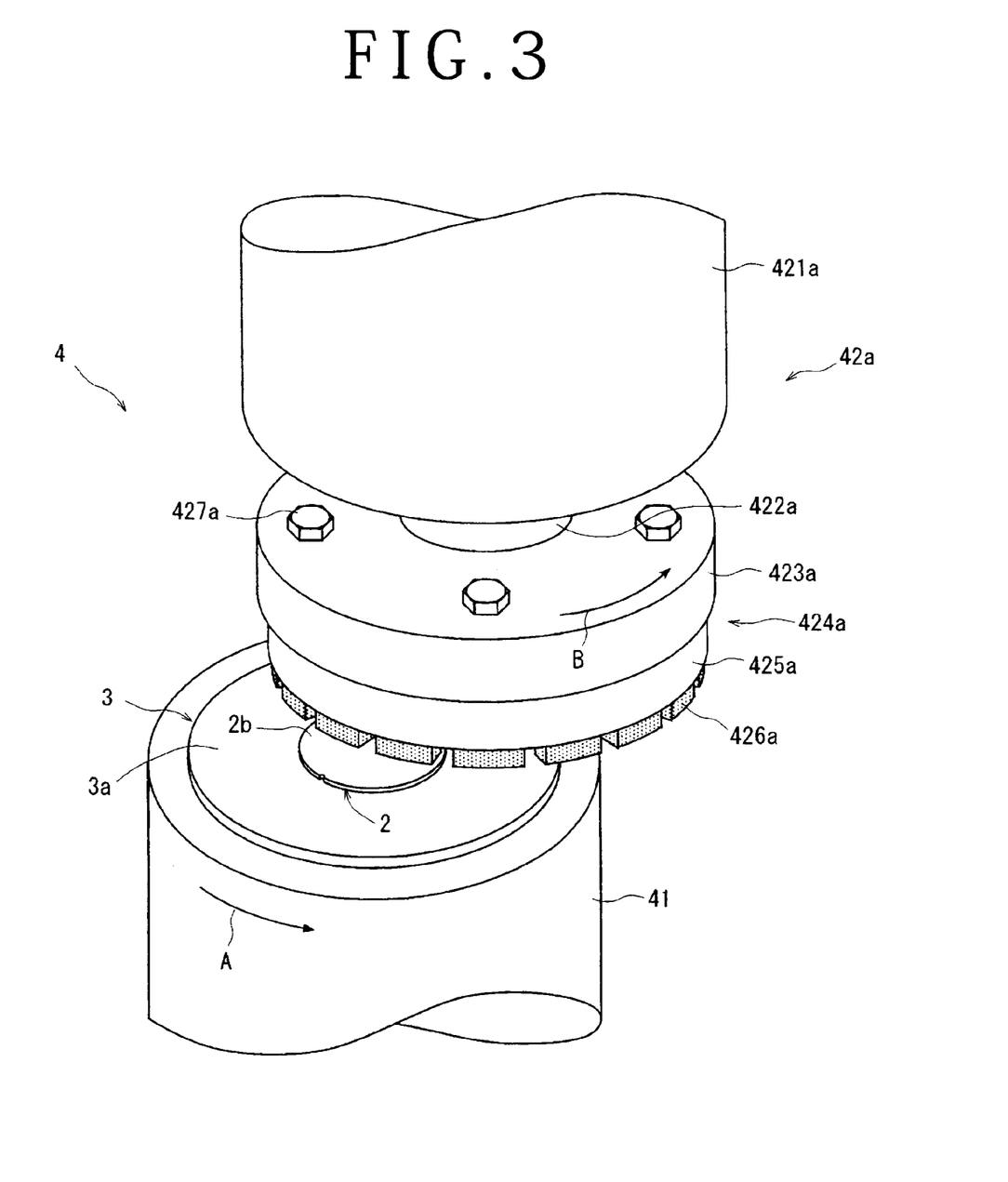
FIG. 3 is an explanatory view illustrating a rough-grinding step of a rear surface grinding step in the optical device wafer dividing method according to the present invention.

The chuck table 41 is rotated in a direction indicated with arrow A in FIG. 3 while sucking and holding the workpiece on its upper surface. The rough-grinding means 42a includes a spindle housing 421a; a rotating spindle 422a rotatably supported by the spindle housing 421a and rotated by a rotation drive mechanism not illustrated; a mounter 423a attached to the lower end of the rotating spindle 422a; and a rough-grinding wheel 424a attached to the lower end of the mounter 423a. The rough-grinding wheel 424a is composed of a disklike base 425a and rough-grinding stones 426a annularly attached to the lower surface of the base 425a. The base 425a is attached to the lower surface of the mounter 423a with fastening bolts 427a. The rough-grinding stones 426a use a metal bonded grinding stone in which diamond abrasive grains each having a diameter of about 60 μm are sintered with a metal bond.

To perform the rough-grinding step using the grinding device 4 described above, the optical device wafer 2 subjected to the protection plate bonding step described above is put on the upper surface (the holding surface) of the chuck table 41 with the protection plate 3 brought into contact therewith. Then, the optical device wafer 2 is sucked and held on the chuck table 41 via the protection plate 3. Thus, the optical device wafer 2 sucked and held on the chuck table 41 via the protection plate 3 is such that its rear surface 2b faces the upside. After the optical device wafer 2 has been sucked and held on the chuck table 41 in this way, while the chuck table 41 is rotated at e.g. 300 rpm in the direction indicated with arrow A, the rough-grinding wheel 424a of the rough-grinding means 42a is rotated at e.g. 1000 rpm in a direction indicated with arrow B and brought into contact with the rear surface 2b of the optical device wafer 2. Then, the rough-grinding wheel 424a is grinding-transferred downward at a grinding-transfer speed of e.g. 0.025 mm/min to rough-grind the rear surface 2b of the optical device wafer 2. In the rough-grinding step, grinding water is supplied to a ground portion. The supply amount of the grinding water may be about four liter/min. Incidentally, a grinding rate in the rough-grinding step is set at 345 μm in the illustrated embodiment. Thus, the optical device wafer 2 subjected to the rough-grinding step has a thickness of 80 μm in this embodiment.

Figure 4:
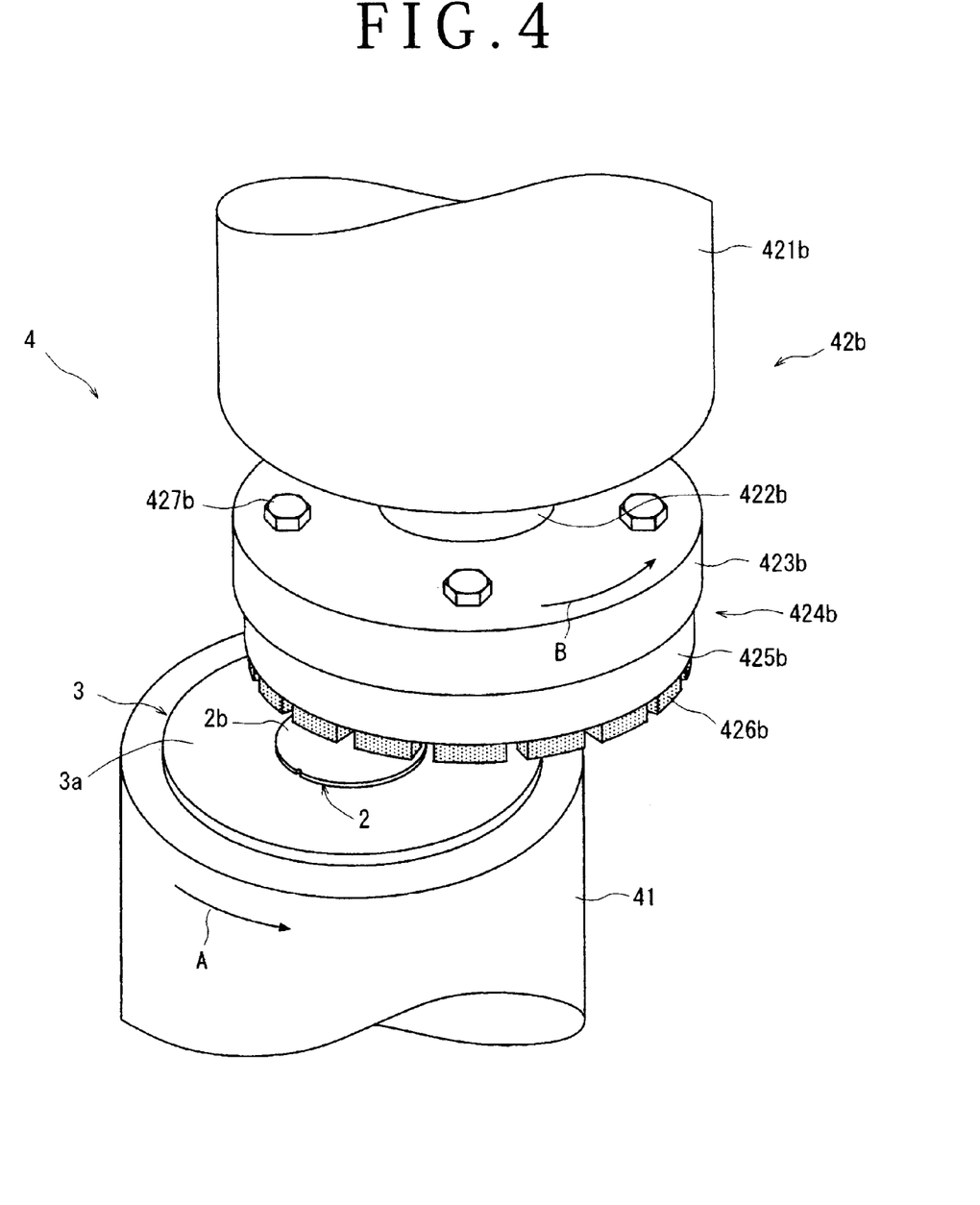
FIG. 4 is an explanatory view illustrating a finish-grinding step of the rear surface grinding step in the optical device wafer dividing method according to the present invention.

After the rough-grinding step has been performed as described above, a finish-grinding step is performed. Referring to FIG. 4, the finish-grinding step is performed using a grinding device 4 substantially similar to the grinding device 4 illustrated in FIG. 3. The grinding device 4 illustrated in FIG. 4 includes a chuck table 41 and finish-grinding means 42b for finish-grinding the processed surface of the wafer held on the chuck table 41. The finish-grinding means 42b includes a spindle housing 421b; a rotating spindle 422b rotatably supported by the spindle housing 421b and rotated by a rotation drive mechanism not illustrated; a mounter 423b attached to the lower end of the rotating spindle 422b; and a finish-grinding wheel 424b attached to the lower surface of the mounter 423b. The finish-grinding wheel 424b is composed of a disklike base 425b and finish-grinding stones 426b annularly attached to the lower surface of the base 425b. The base 425b is attached to the lower surface of the mounter 423b with fastening bolts 427b. The finish-grinding stones 426b use resin bonded grinding stones in which diamond abrasive grains each having a diameter of about 10 μm are sintered with a resin bond. The finish-grinding means 42b configured as above is generally disposed on the same grinding device as the rough-grinding means 42a. In addition, the chuck table 41 holding the workpiece rough-ground by the rough-grinding means 42a is shifted to a machining area of the finish-grinding means 42b.

The finish-grinding step performed using the finish-grinding means 42b described above is next described with reference to FIG. 4. The chuck table 42 holding the optical device wafer 2 subjected to the rough-grinding step by the rough-grinding means 42a is shifted to the machining area of the finish-grinding means 42b illustrated in FIG. 4. After the chuck table 42 has been shifted to the machining area illustrated in FIG. 4, while the chuck table 41 is rotated at e.g. 300 rpm in the direction indicated with arrow A, the finish-grinding wheel 424b of the finish-grinding means 42b is rotated at e.g. 1500 rpm in a direction indicated with arrow B and brought into contact with the rear surface 2b of the optical device wafer 2. Then, the finish-grinding wheel 424b is grinding-transferred downward at a grinding-transfer speed of e.g. 0.009 mm/min to finish-grind the rear surface 2b of the optical device wafer 2. In the finish-grinding step, grinding water is supplied to the grinding process portion. The supply amount of the grinding water may be about four liter/min. Incidentally, a grinding rate in the finish-grinding step is set at 55 μm. Thus, the optical device wafer 2 subjected to the rough-grinding step has a thickness of 25 μm in this embodiment.

In the way as described above, the optical device wafer 2 subjected to the rear surface grinding step including the rough-grinding step and the finish-grinding step is formed to have a thickness of as extremely thin as 25 μm. However, since the optical device wafer 2 is stuck to the high-rigid protection plate 3, it will not crack.

Figure 5A:
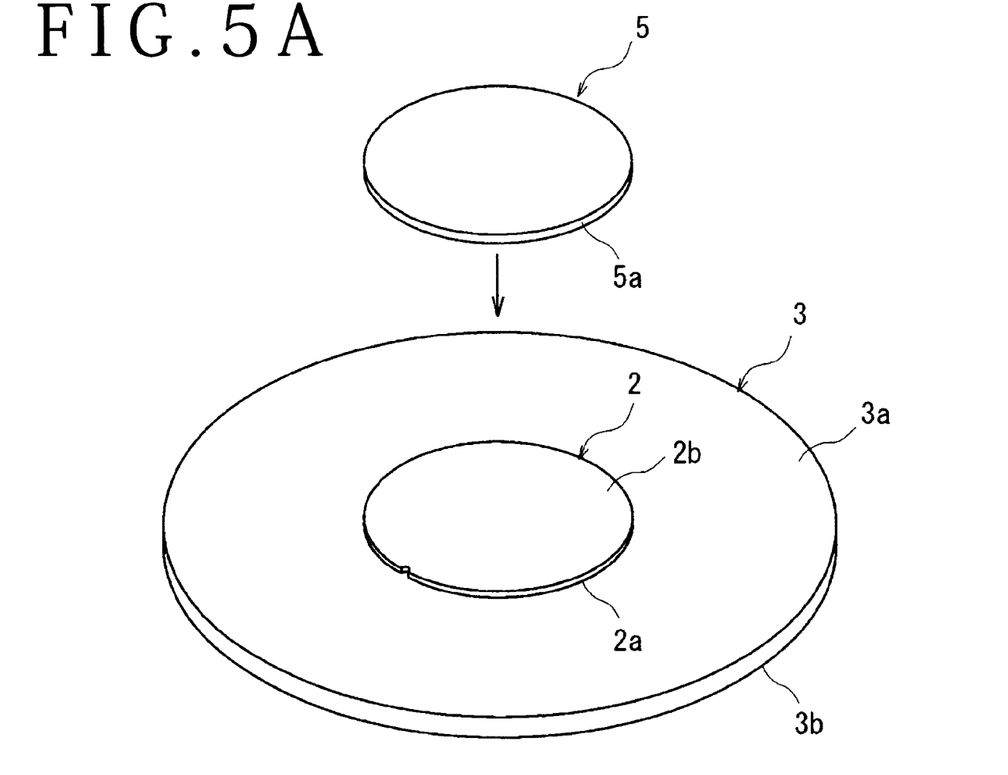
FIGS. 5A and 5B are explanatory views illustrating a reinforcing substrate sticking step in the optical device wafer dividing method according to the present invention.
Figure 5B:
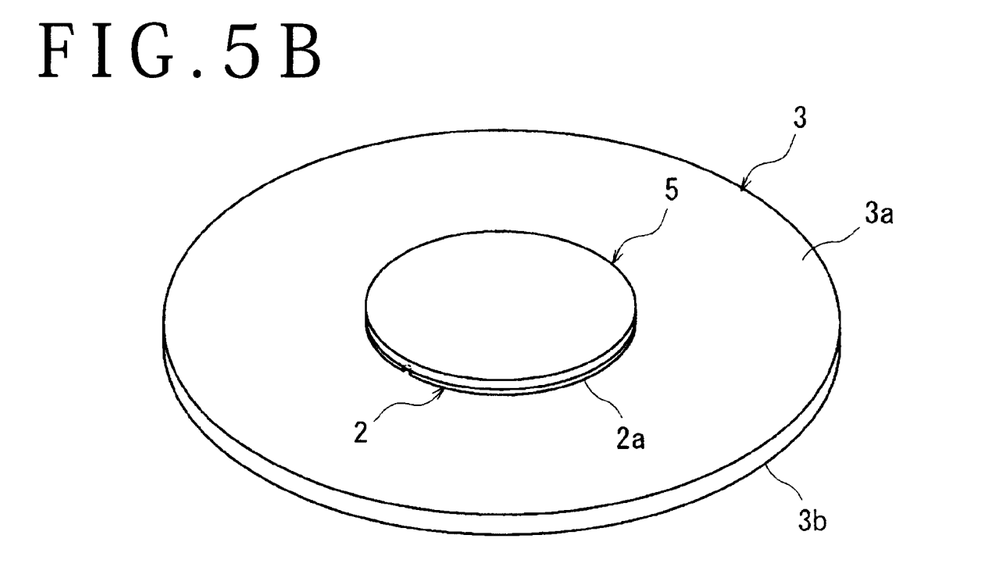

After the rear surface grinding step has been performed, a reinforcing substrate bonding step is performed in which a front surface of a high-rigid reinforcing substrate is bonded to the rear surface 2b of the optical device wafer 2 with a peelable adhesion bond. Referring to FIGS. 5A and 5B, the front surface 5a of the high-rigid reinforcing substrate 5 is bonded to the rear surface 2b of the optical device wafer 2 stuck to the front surface 3a of the protection plate 3. The reinforcing substrate 5 is formed of a high-rigid material such as a sapphire substrate or the like in a disklike shape so as to have the flat front surface 5a and rear surface 5b. It is preferable that the reinforcing substrate 5 has a thickness of about 70 μm if it is formed of a sapphire substrate or the like. The material forming the reinforcing substrate 5 can use a glass substrate as well as the sapphire substrate. The peelable adhesion bond can use e.g. wax melting at a temperature of 100° C.

Figure 6:
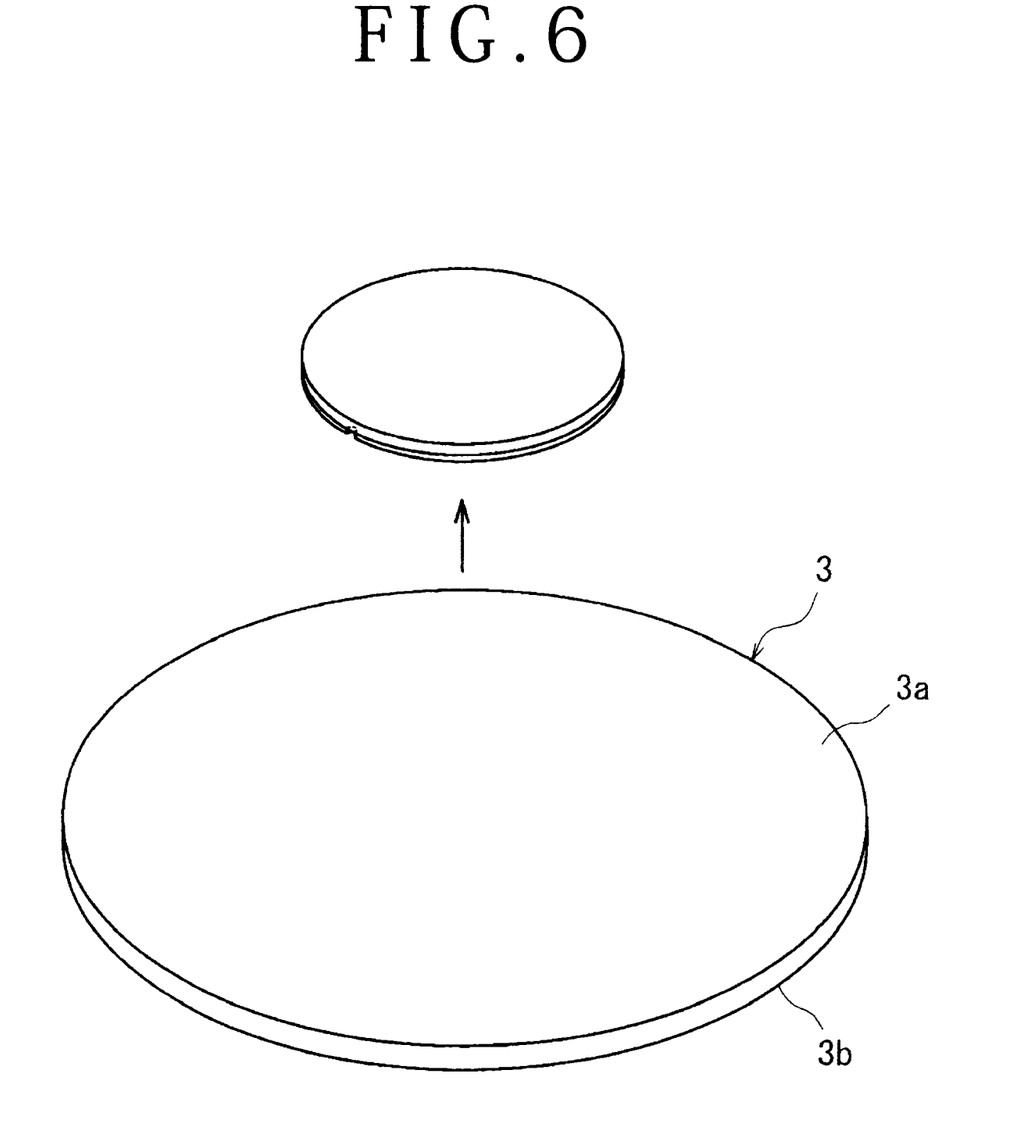
FIG. 6 is an explanatory view illustrating a wafer peeling-off step in the optical device wafer dividing method according to the present invention.

After the reinforcing substrate bonding step described above has been performed, a wafer peeling-off step is performed in which the optical device wafer 2 bonded to the reinforcing substrate 5 is peeled off from the protection plate 3 as illustrated in FIG. 6. In the wafer peeling-off step, the protection plate 3 is heated to about 70° C. to melt the wax bonding the protection plate 3 with the optical device wafer 2. Thus, the optical device wafer 2 bonded to the reinforcing substrate 5 can be peeled off from the protection plate 3 with ease.

Figure 7:
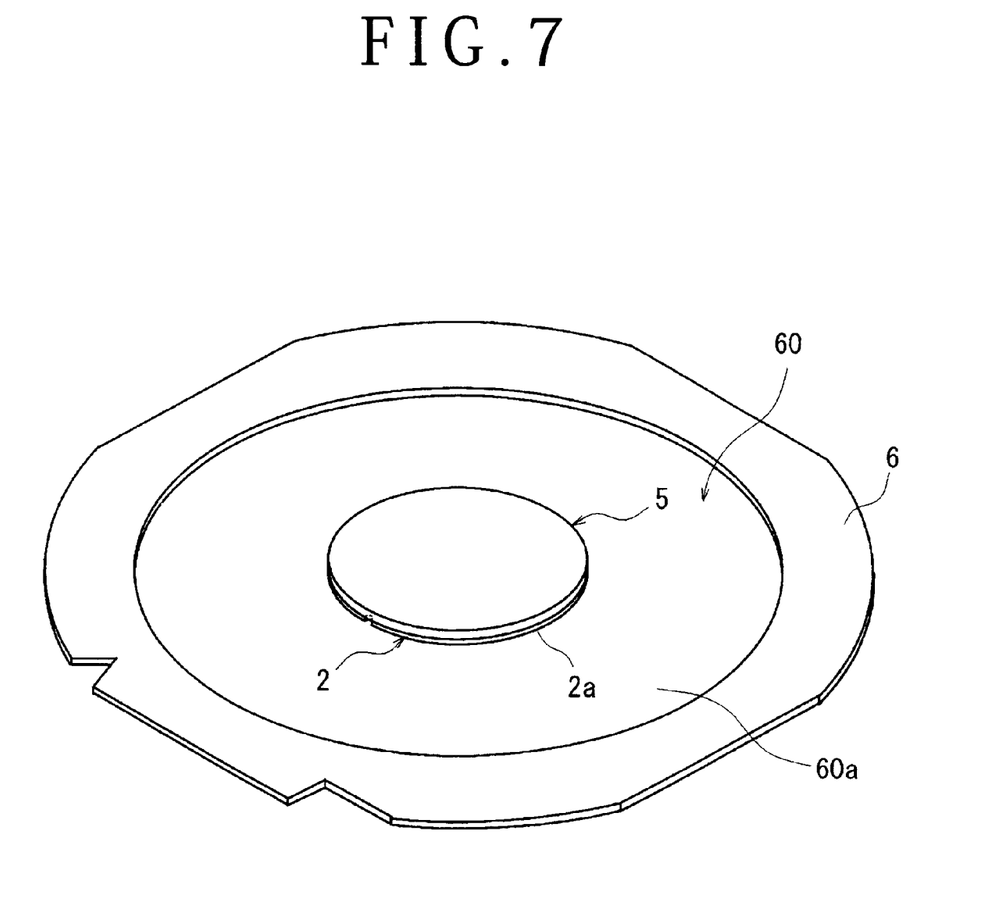
FIG. 7 is an explanatory view illustrating a dicing tape sticking step in the optical device wafer dividing method according to the present invention.

A dicing tape sticking step is next performed in which the front surface 2a of the optical device wafer 2 bonded with the reinforcing substrate 5 is stuck to the front surface of a dicing tape. Specifically, as illustrated in FIG. 7, the front surface 2a of the optical device wafer 2 bonded with the reinforcing substrate 5 is stuck to a front surface 60a of the dicing tape 60. The dicing tape 60 is attached at its outer circumferential portion so as to cover the inner opening portion of an annular frame 6.

After the dicing tape sticking step described above has been performed, a laser processing step is performed as below. A laser beam is emitted to the rear surface 5b of the reinforcing substrate 5 bonded to the optical device wafer 2 stuck to the dicing tape 60, along the streets 21 formed on the optical device wafer 2. Thus, laser processing is performed on the reinforcing substrate 5 to form fracture-starting points along the streets 21. The laser processing step is performed using a laser processing machine illustrated in FIG. 8. The laser processing machine 7 illustrated in FIG. 8 includes a chuck table 71 adapted to hold a workpiece; laser beam irradiation means 72 for emitting a laser beam to the workpiece held on the chuck table 71; and image pickup means 73 for picking up an image of the workpiece held on the chuck table 71. The chuck table 71 is configured to suck and hold the workpiece. In addition, the chuck table 71 is shifted in a processing-transfer direction indicated with arrow X in FIG. 8 by processing-transfer means not illustrated and in an indexing-transfer direction indicated with arrow Y in FIG. 8 by indexing-transfer means not illustrated.

Figure 8:
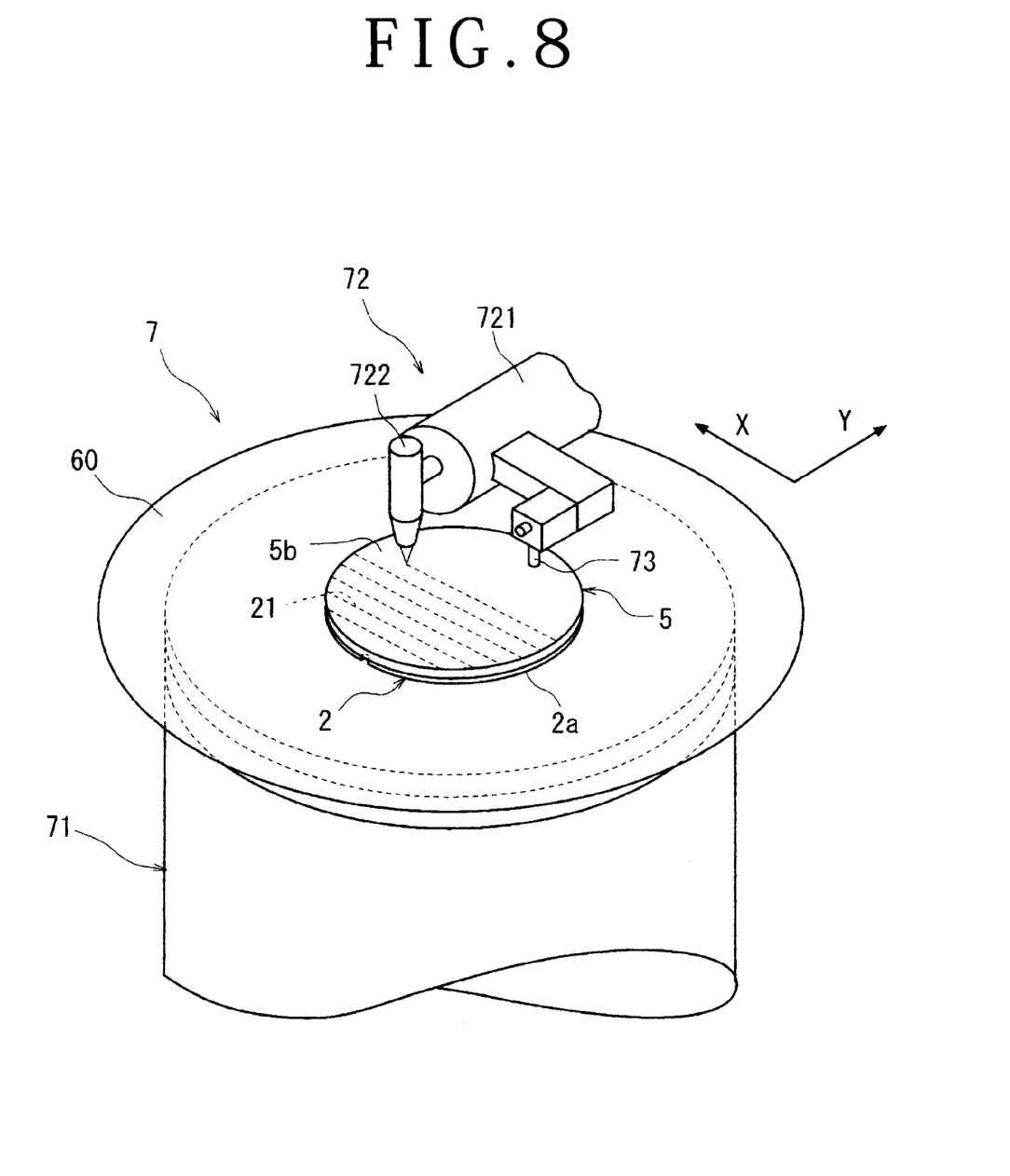
FIG. 8 is a perspective view illustrating an essential portion of a laser processing machine for performing a laser processing step in the optical device wafer dividing method according to the present invention.

The laser beam irradiation means 72 includes a cylindrical casing 721 arranged to extend substantially horizontally. The casing 721 internally includes pulse laser beam oscillation means equipped with a laser beam oscillator and repetition frequency setting means both not illustrated. A collector 722 is attached to the leading end of the casing 721 to collect pulse laser beams emitted from the pulse laser beam oscillation means.

The image pickup means 73 attached to an end of the casing 721 constituting part of the laser beam irradiation means 722 includes infrared illumination means for emitting an infrared ray to a workpiece; an optical system adapted to capture the infrared ray emitted by the infrared illumination means; and an image pickup element (an infrared CCD) adapted to output an electric signal corresponding to the infrared ray captured by the optical system; as well as a usual image pickup element (CCD) adapted to pick up an image through a visible beam in the illustrated embodiment. The image pickup means 73 sends a signal of an image picked up to control means not illustrated.

A laser processing step is below described in which the laser processing is performed by use of the above-described laser processing machine 7 on the reinforcing substrate 5 along the streets 21 to form fracture-starting points. In a first embodiment of the laser processing step, an altered layer forming step is performed in which altered layers are formed inside the reinforcing substrate 5 along the streets 21 formed in the optical device wafer 2. To perform the altered layer forming step, the optical device wafer 2 bonded with the reinforcing substrate 5 is put on the chuck table 71 of the laser processing machine 7 with the dicing tape 60 opposed to the chuck table 71 as illustrated in FIG. 8. The optical device wafer 2 is sucked and held on the chuck table 71 by sucking means not illustrated (a wafer holding step). Thus, the rear surface 5b of the reinforcing substrate 5 stuck to the optical device wafer 2 sucked and held on the chuck table 71 faces the upside. Incidentally, although FIG. 8 omits the annular frame 6 attached to the dicing tape 60, the annular frame 6 is held by any frame holding means disposed on the chuck table 71.

After the wafer holding step has been performed as described above, an altered layer forming step is performed. In the altered layer forming step, a laser beam having a wavelength capable of passing through the reinforcing substrate 5 is directed to the reinforcing substrate 5 from the rear surface 5b thereof along the streets 21 formed on the optical device wafer 2 to form altered layers in the reinforcing substrate 5 along the streets 21. To perform the altered layer forming step, the chuck table 71 sucking and holding the reinforcing substrate 5 bonded to the optical device wafer 2 is first positioned immediately below the image pickup means 73 by a shifting mechanism not illustrated. Then, alignment work is performed to detect a processing area of the reinforcing substrate 5 to be subjected to laser processing by the image pickup means 73 and control means not illustrated. Specifically, the image pickup means 73 and the control means execute image processing such as pattern matching for alignment of a laser beam irradiation position. The pattern matching is executed to perform positioning between a street 21 formed in a given direction of the optical device wafer 2 and the collector 722 of the laser beam irradiation means 72 for directing a laser beam along the street 21. Similarly, the alignment of a laser beam irradiation position is performed on a street 21 extending perpendicularly to the given direction formed in the optical device wafer 2 (an alignment step). In this case, the front surface 2a formed with the streets 21 of the optical device wafer 2 is located on the bottom side of the reinforcing substrate 5. However, since the image pickup means 73 is composed of the infrared illumination means, the optical system for capturing an infrared ray, the image pickup element (infrared CCD) for outputting an electric signal corresponding to the infrared ray, etc., as described above, it can pick up an image of the street 21 through the reinforcing substrate 5.

Figure 9A:
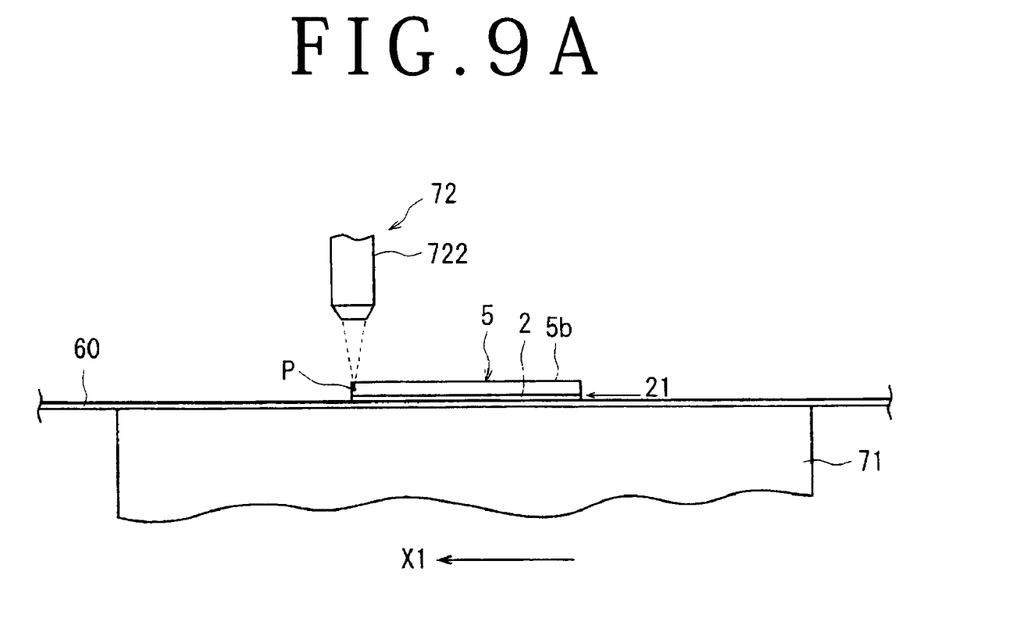
FIGS. 9A and 9B are explanatory views illustrating an altered layer forming step of the laser processing step in the optical device wafer dividing method according to the present invention.
Figure 9B:
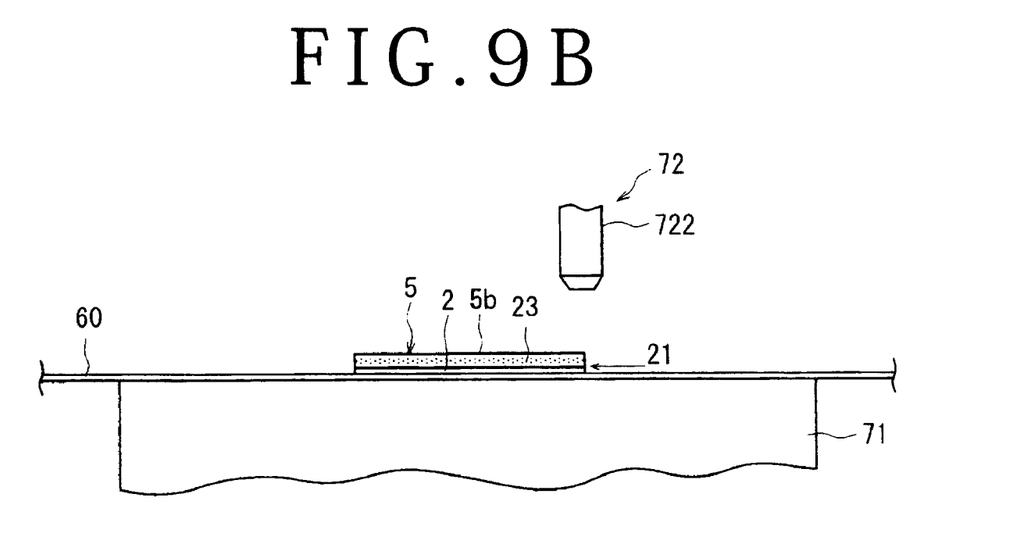

After the alignment step has been performed as described above, in FIG. 9A, the chuck table 71 is shifted to a laser beam irradiation area at which the collector 722 of the laser beam irradiation means 72 for emitting a laser beam is located. Thus, one end (the left end in FIG. 9A) of a given street 21 is located immediately below the collector 722 of the laser beam irradiation means 72. While a laser beam having a wavelength capable of passing through the reinforcing substrate 5 is emitted from the collector 722 to the reinforcing substrate 5, the chuck table 71 is shifted at a given transfer speed in a direction indicated with arrow X1 in FIG. 9A. Then, as illustrated in FIG. 9B, when the irradiation position of the collector 722 reaches the other end position of the street 21, the irradiation of a pulse laser beam is stopped and the shifting of the chuck table 71 is stopped. In the altered layer forming step, a focusing point P of the pulse laser beam is positioned at a thickness-wise intermediate portion (the inside) of the optical device wafer 2. Consequently, an altered layer 23 is formed inside the reinforcing substrate 5 along the street 21.

For example, processing conditions in the altered layer forming step are set as below.

| | |
|---|---|
| Light source: | Er pulse laser |
| Wavelength: | 1560 nm |
| Repetition frequency: | 90 to 200 kHz |
| Average output: | 0.8 to 1.2 W |
| Processing-transfer speed: | 100 to 300 mm/sec |

After the altered layer forming step has been performed on all the streets 21 extending in the given direction of the optical device wafer 2 as described above, the chuck table 71 is turned at 90 degrees and the altered layer forming step is performed on all the streets 21 extending perpendicularly to the given direction.

A description is next given of a second embodiment of the laser processing step in which laser processing is performed on the reinforcing substrate 5 to form fracture-staring points along the streets 21. In the second embodiment of the laser processing step, a laser processing groove forming step is performed in which laser processing grooves are formed on the rear surface 5b of the reinforcing substrate 5 along the streets formed on the optical device wafer 2. Incidentally, the laser processing groove forming step is performed using a laser processing machine similar to the laser processing machine illustrated in FIG. 8. To perform the laser processing groove forming step, a wafer holding step and an alignment step are performed similarly to the altered layer forming step described above.

Figure 10A:
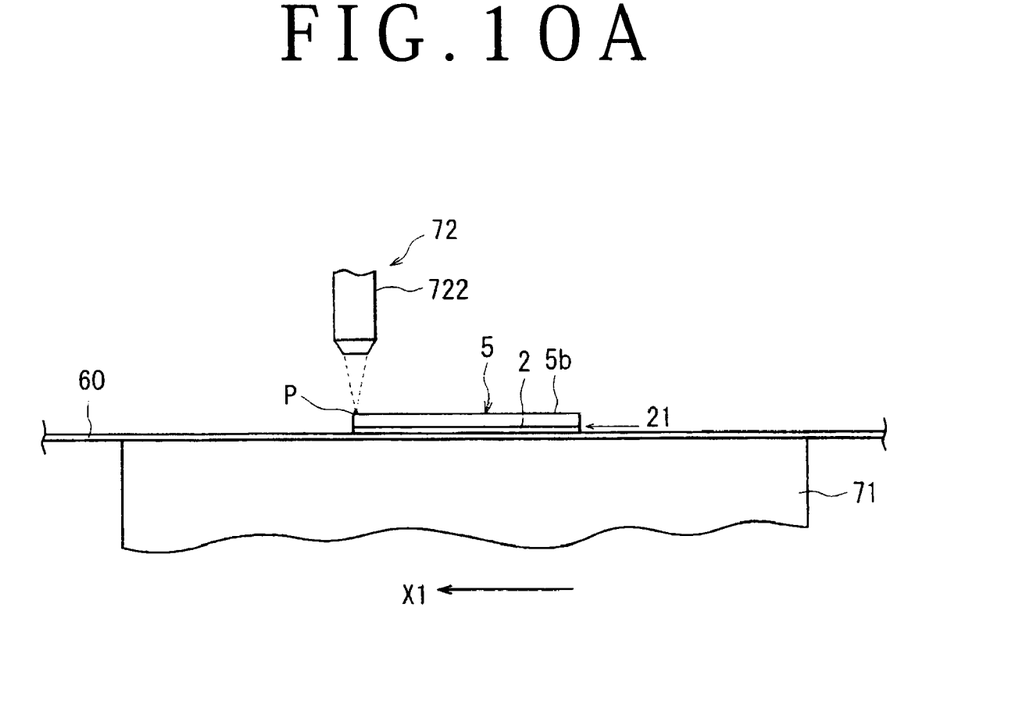
FIGS. 10A and 10B are explanatory views illustrating a laser processed groove of the laser processing step in the optical device wafer dividing method according to the present invention.
Figure 10B:
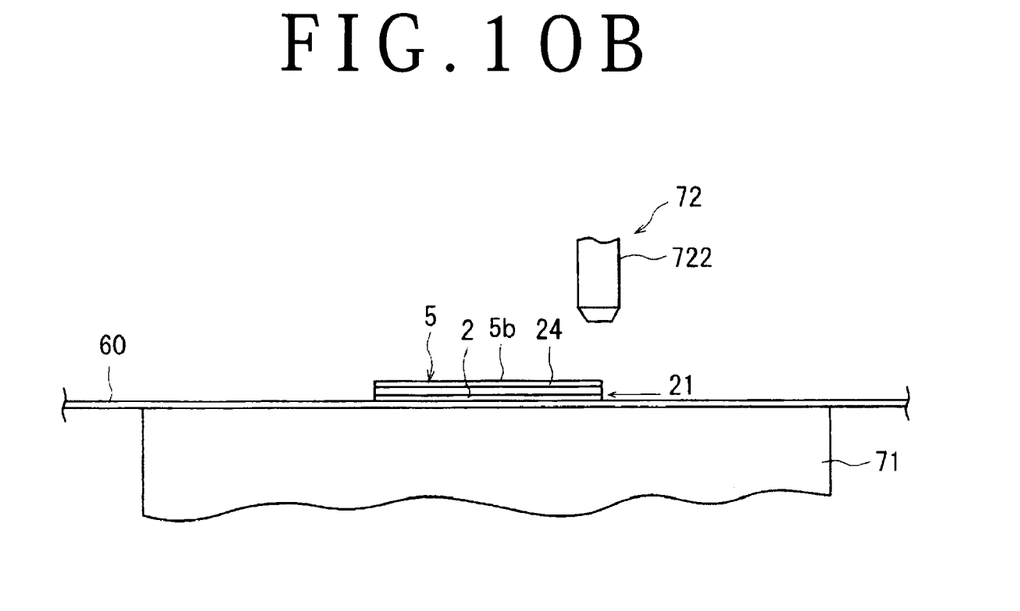

After the alignment step has been performed, as illustrated in FIG. 10A, the chuck table 71 is shifted to a laser beam irradiation area at which the collector 722 of the laser beam irradiation means 72 for emitting a laser beam. Thus, one end (the left end in FIG. 10A) of a given street 21 is positioned immediately below the collector 722 of the laser beam irradiation means 72. While the collector 722 emits to the reinforcing substrate 5 a pulse laser beam having a wavelength capable of being absorbed by the reinforcing substrate 5, the chuck table 71 is shifted at a given transfer speed in the direction indicated with arrow X1. Then, when the irradiation position of the collector 722 reaches the other end position of the street 21, the irradiation of the pulse laser beam is stopped and the shifting of the chuck table 71 is stopped. In the laser processing groove forming step, a focusing point P of the pulse laser beam is positioned near the rear surface 5b (the upper surface) of the reinforcing substrate 5. Consequently, the laser processing groove 24 is formed on the rear surface 5b of the reinforcing substrate 5 along the street 21.

For example, processing conditions in the laser processing groove forming step are set as below.

| | |
|---|---|
| Light source: | YAG pulse laser |
| Wavelength: | 355 nm (the third harmonic wave of the YAG laser) |
| Repetition frequency: | 90 to 200 kHz |
| Average output: | 0.8 to 1.2 W |
| Processing-transfer speed: | 100 to 300 mm/sec |

After the laser processing groove forming step has been performed on all the streets 21 extending in the given direction of the optical device wafer 2 as described above, the chuck table 71 is turned at 90 degrees and the laser processing groove forming step is performed on all the streets 21 extending perpendicularly to the given direction.

Figure 11A:
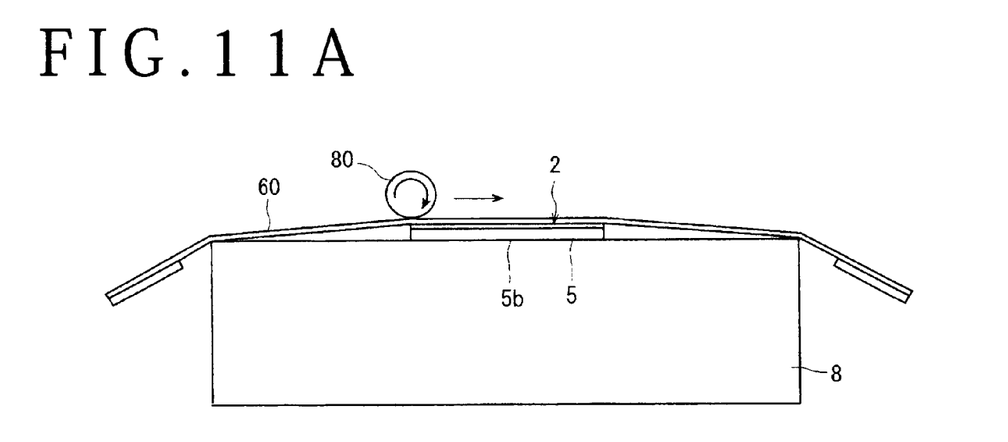
FIGS. 11A, 11B and 11C are explanatory views illustrating a wafer dividing step in the optical device wafer dividing method according to the present invention.
Figure 11B:
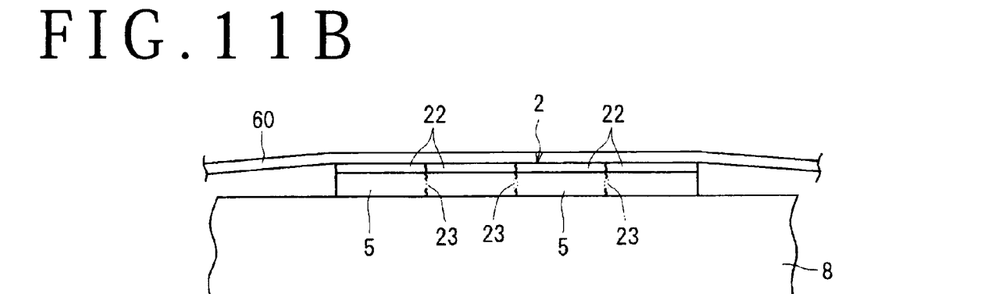
Figure 11C:
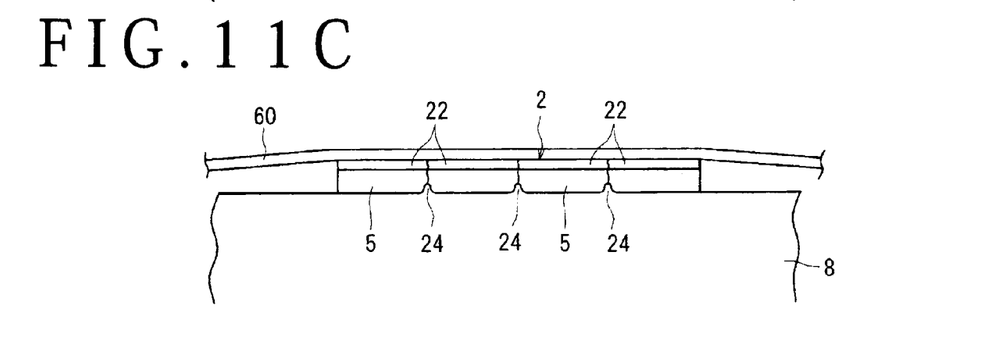

A wafer dividing step is next performed in which an external force is applied to the fracture starting points (the altered layer 23 or the laser processing groove 24) of the reinforcing substrate 5 subjected to the laser processing step described above to fracture the optical device wafer 2 along the streets 21 to divide it into the individual optical devices. In the wafer dividing step, the reinforcing substrate 5 subjected to the laser processing step described above is put on a soft rubber sheet 8 from the rear surface 5b as illustrated in FIG. 11A. Thus, the optical device wafer 2 stuck with the front surface 2a of the reinforcing substrate 5 faces the upside and the dicing tape 60 stuck with the optical device wafer 2 assumes a highest position. While pressing the upper surface of the dicing tape 60, a pressing roller 80 rolls thereon to fracture the reinforcing substrate 5 along the streets 21 from the altered layers 23 or laser processing grooves 24 serving as fracture starting points as illustrated in FIG. 11B and 11C.

The optical device wafer 2 stuck with the reinforcing substrate 5 is formed to have a thickness of as extremely thin as 25 μm as described above. Therefore, the optical device wafer 2 is fractured along the streets 21 along with the fracture of the reinforcing substrate 5 along the streets 21, thus, being divided into individual optical devices 22. The lateral surface (the fracture surface) of the optical device 22 thus divided has no altered portion subjected to laser processing. Thus, the optical device 22 will not be reduced not only in luminance but in bending strength. Incidentally, since the individually divided optical devices 22 are stuck with the dicing tape 60 on their front surfaces, they have the formation of the optical device wafer 2 without being scattered.

Figure 12:
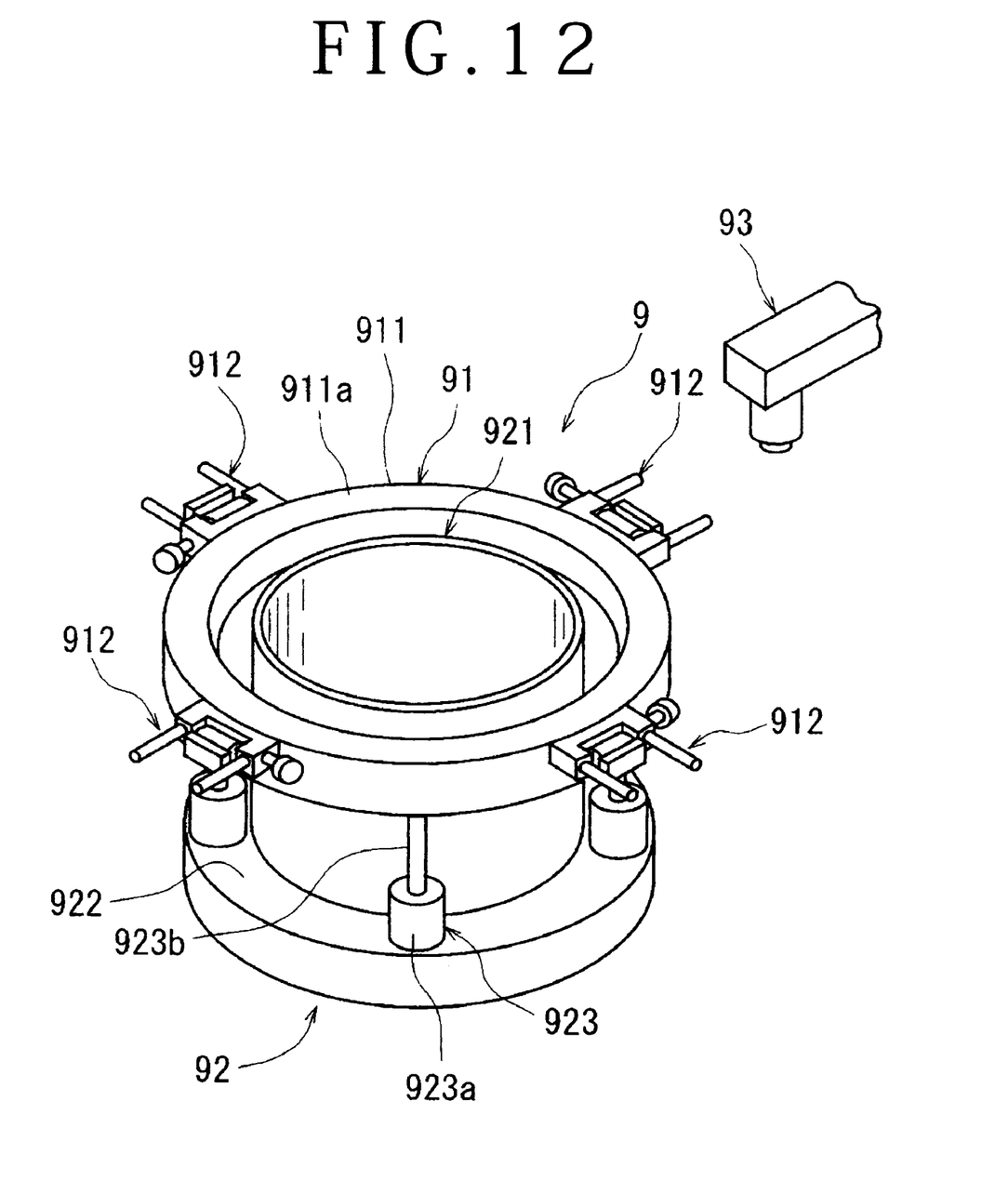
FIG. 12 is a perspective view of a picking-up device for performing a picking-up step in the optical device wafer dividing method according to the present invention.

A picking-up step is next performed in which the optical devices 22 divided by performing the wafer dividing step described above are peeled off from the dicing tape 60 for picking up. This picking-up step is performed using a picking-up device 9 illustrated in FIG. 12. The picking-up device 9 illustrated in FIG. 12 includes frame holding means 91 for holding the annular frame 6; tape expanding means 92 for expanding the dicing tape 60 attached to the annular frame 6 held by the frame holding means 91; and a pickup collet 93. The frame holding means 91 includes an annular frame holding member 911; and a plurality of clamps 912 as securing means arranged on the outer circumference of the frame holding member 911. The frame holding member 911 has an upper surface formed as a placing surface 911a adapted to receive the annular frame 6 placed thereon. The annular frame 6 is placed on the placing surface 911a. The annular frame 6 placed on the placing surface 911a is secured to the frame holding member 911 by means of the clamps 912. The frame holding means 91 configured as above is supported by the tape expanding means 92 so as to be movable upward and downward.

Figure 13A:
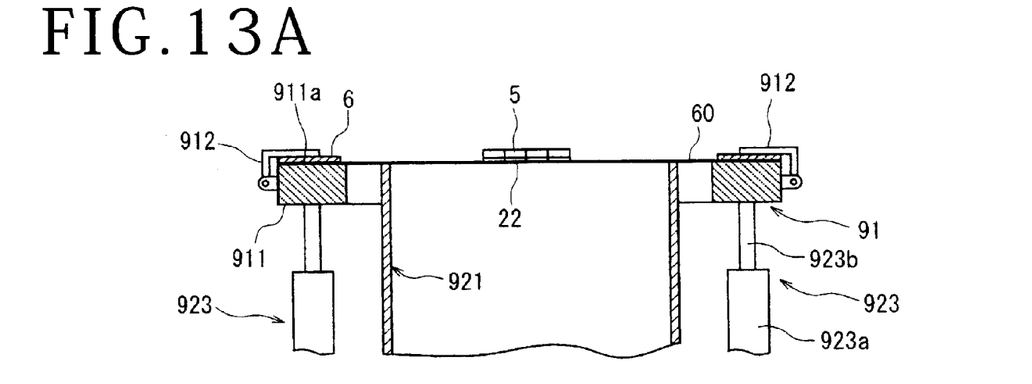
FIGS. 13A, 13B and 13C are explanatory views of a picking-up step in the optical device wafer dividing method according to the present invention.
Figure 13B:
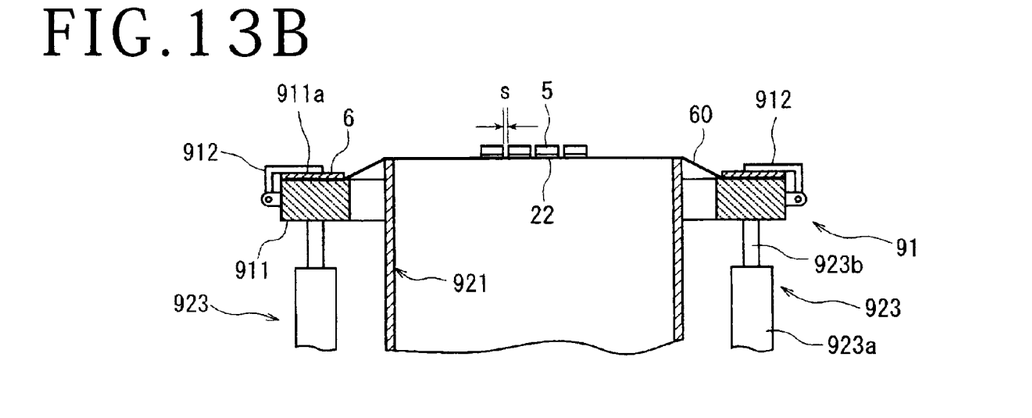

The tape expanding means 92 is equipped with an expansion drum 921 disposed inside the annular frame holding member 911. The expanding drum 921 has inner and outer diameters smaller than the inner diameter of the annular frame 6 and greater than the outer diameter of the optical device wafer 2 stuck to the dicing tape 60 attached to the annular frame 6. The expansion drum 921 is provided with a support flange 922 at a lower end. The tape expanding means 92 in the illustrated embodiment is provided with support means 923 capable of lifting and lowering the annular frame holding means 911. The support means 923 is composed of a plurality of air cylinders 923a arranged on the support flange 922 and their piston rods 923b are connected to the lower surface of the annular frame holding member 911. The support means 923 composed of the air cylinders 923a vertically shifts the annular frame member 911 between a reference position and an expansion position. The reference position is such that the placing surface 911a takes almost the same height as that of the upper end of the expansion drum 921 as illustrated in FIG. 13A. The expansion position is lower than the upper end of the expansion drum 921 by a given volume as illustrated in FIG. 13B.

The picking-up step performed using the picking-up device 9 configured as described above is described with reference to FIGS. 13A, 13B and 13C. The optical device wafer 2 where the individual optical devices 22 are divided along the streets 21 is stuck to the dicing tape 60, which is attached to the annular frame 6. This annular frame 6 is placed on the placing surface 911a of the frame holding member 911 constituting the frame holding means 91 and secured to the frame member 911 by means of the clamps 912 as illustrated in FIG. 13A. In this case, the frame holding member 911 is positioned at the reference position illustrated in FIG. 13A. Next, the air cylinders 923a as the support means 923 constituting the tape expanding means 92 are operated to lower the annular frame holding member 911 to the expansion position illustrated in FIG. 13B. In this way, also the annular frame 6 secured onto the placing surface 911a of the frame holding member 911 is lowered. Therefore, the dicing tape 60 attached to the annular frame 6 is brought into contact with the upper end edge of the expansion drum 921 for expansion.

Figure 13C:
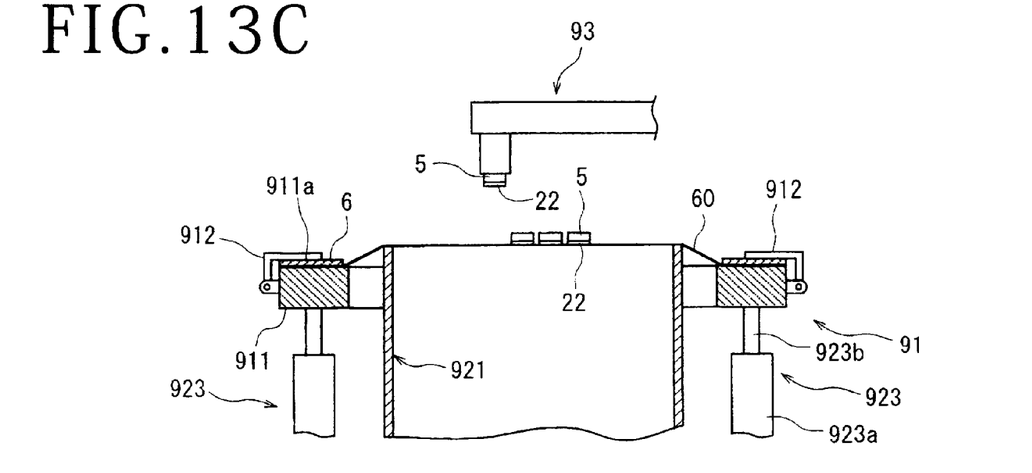

Consequently, the adjacent optical devices 22 stuck to the dicing tape T are separated to have an increased gap S therebetween. As illustrated in FIG. 13C, the pickup collet 93 is operated to attract, peel off and pick up the reinforcing substrate 5 stuck to the optical devices 22 from the dicing tape 60, and conveys it to a tray not illustrated. In the picking-up step described above, the adjacent optical devices 22 are separated to have the increased gap S therebetween; therefore, they can easily be picked up without contact with each other.

The reinforcing substrate 5 bonded to the optical device 22 picked up as described above is peeled off from the optical device 22 before a die bonding step as the next step will be performed (a reinforcing peeling-off step). In this case, the wax bonding the reinforcing substrate 5 to the optical device wafer 2 is melted by heating the reinforcing substrate 5 at about 100° C. Therefore, the reinforcing substrate 5 can easily be peeled off from the optical device wafer 2. Incidentally, the reinforcing substrate peeling-off step for peeling off the reinforcing substrate 5 from the optical device wafer 2 may be performed before the above-described picking-up step will be performed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer dividing method for dividing an optical device wafer into individual optical devices along a plurality of streets, the optical device wafer being formed with the optical devices in a plurality of areas sectioned by the streets formed in a latticelike pattern on a front surface, the method comprising:

a protection plate bonding step for bonding a front surface of the optical device wafer to a front surface of a high-rigid protection plate with a peelable adhesion bond;

a rear surface grinding step for grinding a rear surface of the optical device wafer stuck to the protection plate to form the optical device wafer at a device finish thickness;

a reinforcing substrate bonding step for bonding a front surface of a high-rigid reinforcing substrate to the rear surface of the optical device wafer subjected to the rear surface grinding step with a peelable adhesion bond;

a wafer peeling-off step for peeling off the optical device wafer stuck with the reinforcing substrate from the protection plate;

a dicing tape sticking step for sticking the front surface of the optical device wafer bonded with the reinforcing substrate to a front surface of a dicing tape;

a laser processing step for emitting a laser beam along the streets formed on the optical device wafer from the rear surface of the reinforcing substrate bonded to the optical device wafer stuck to the dicing tape to perform laser processing on the reinforcing substrate along the streets to form fracture starting points;

a wafer dividing step for applying an external force along the fracture starting points of the reinforcing substrate subjected to the laser processing step to fracture the reinforcing substrate and the optical device wafer along the fracture starting points into individual optical devices; and a pick-up step for peeling-off and picking up, from the dicing tape, the optical devices divided by performing the wafer dividing step.

2. The optical device wafer dividing method according to claim 1, wherein said laser processing step is such that a laser beam having a wavelength capable of passing through the reinforcing substrate is directed to the reinforcing substrate while being focused on the inside of the reinforcing substrate, forming an altered layer serving as a fracture starting point along the street.

3. The optical device wafer dividing method according to claim 1, wherein said laser processing step is such that a laser beam having a wavelength capable of being absorbed by the reinforcing substrate is directed to the rear surface of the reinforcing substrate to form a laser processing groove serving as a fracture starting point along the street.

4. The optical device wafer dividing method according to claim 1, further comprising:

a reinforcing substrate peeling-off step for peeling off the reinforcing substrate stuck to the optical devices divided before or after the picking-up step will be or has been performed.

* * * * *